US006367057B1

(12) United States Patent
Parashkevov

(10) Patent No.: US 6,367,057 B1
(45) Date of Patent: Apr. 2, 2002

(54) METHOD OF ANALYZING A CIRCUIT HAVING AT LEAST ONE STRUCTURAL LOOP WITHIN A CHANNEL CONNECTED COMPONENT

(75) Inventor: Atanas Nikolaev Parashkevov, Valley View (AU)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/393,629

(22) Filed: Sep. 10, 1999

(51) Int. Cl.$^7$ .............................................. G06F 17/50
(52) U.S. Cl. .................................. 716/5; 716/4; 716/6
(58) Field of Search ................................ 716/5, 4, 6, 3, 716/18

(56) References Cited

U.S. PATENT DOCUMENTS

| | | | |
|---|---|---|---|
| 5,084,824 A | | 1/1992 | Lam et al. ...................... 716/11 |
| 5,210,699 A | | 5/1993 | Harrington ...................... 716/5 |
| 5,553,008 A | * | 9/1996 | Huang et al. .................. 703/14 |
| 5,629,858 A | | 5/1997 | Kundu et al. ................... 716/1 |
| 5,677,848 A | | 10/1997 | Singh et al ..................... 703/2 |
| 5,883,811 A | * | 3/1999 | Lam .............................. 716/6 |
| 5,946,475 A | * | 8/1999 | Burks et al. .................... 716/6 |
| 6,014,510 A | * | 1/2000 | Burks et al. .................. 703/19 |
| 6,185,723 B1 | * | 2/2001 | Burks et al. .................... 716/6 |

OTHER PUBLICATIONS

"Boolean Analysis of MOS Circuits" by R. E. Bryant published in IEEE TCAD, 6(4), pp. 634–649, Jul. 1987.
"Extraction of Gate–Level Models from Transistor Circuits by Four–Valued Symbolic Analysis" by R. E. Bryant and published in ICCAD'91.
"Comparing Layouts with HDL Models: a Formal Verification Technique" by T. Kam and P. A. Subrahmanyam published in IEEE TCAD, Apr. 1995, pp. 503–509.
"Verify—a Formal Verification Program for Custom CMOS Circuits" by A. Kuehlmann, A. Srinivasan and D. P. LaPotin published in the IBM R & D Journal, vol. 39, pp. 149–165, Jan.—Mar. 1995.

"VERTEX: Verification of Transistor–Level Circuits based on model Extraction" by J. Moondanos, J.A. Wehbeh, J.A. Abraham and D.G. Saab and published in EDAC '93.

"Analysis of Cyclic Combinational Circuits" by Sharad Malik published by IEEE 1993.

"Error Diagnosis for Transistor–Level Verification" by A. Kuehlmann, D.I. Cheng, A. Srinivasan and D.P. LaPotin, No Date.

"The Necessity of Closed Circuit Loops in Minimal Combinational Circuits" by W.H. Kautz in IEEE Transactions on Computers, Feb. 1970, pp. 162–164.

"Formal Verification of PowerPC™ arrays using symbolic trajectory evaluation" by M. Pandey, R. Raimi, D.L. Beatty and R.E. Bryant and published at the $33^{rd}$ Design Automation Conference in 1996.

* cited by examiner

Primary Examiner—Vuthe Siek
(74) Attorney, Agent, or Firm—Daniel K. Nichols

(57) ABSTRACT

A method of analyzing a circuit having at least one structural loop within a channel connected component first requires that the circuit be at least partly notionally split into its constituent channel connected components (100). The structural loops within a channel-connected component are then detected and a pair of temporary boolean variables is inserted at a break point in each structural loop in the channel-connected component at an internal input. The channel connected component is then analyzed utilizing the pairs of temporary boolean variables at the break points in order to obtain a pair of boolean equations at each break point representing the functionality of the channel connected component at that break point to produce a system of boolean equations for the break points within the channel connected component (101). The system of boolean equations is then solved to produce a result that indicates whether the channel connected component has oscillatory, combinational or sequential behavior.

9 Claims, 4 Drawing Sheets

METHOD OF ANALYZING A CIRCUIT HAVING AT LEAST ONE STRUCTURAL LOOP WITHIN A CHANNEL CONNECTED COMPONENT

FIELD OF THE INVNETION

This invention relates to a method of analyzing a circuit having at least one structural loop within a single channel connected component within the circuit, especially, though not exclusively, for use in Computer-Aided Design (CAD) tools for Electronic Design Automation (EDA), and more particularly for deriving equivalent behavior of mixed (gate and switch) level digital circuits.

BACKGROUND OF THE INVENTION

Contemporary chip design depends critically on the availability of appropriate EDA CAD tools in order to keep up with the ever-increasing chip complexity. Designers typically work with chip descriptions at several levels of abstraction. The Register-Transfer Level (RTL) describes a circuit at the high level of boolean functions and data flow within the circuit much like a regular programming language does. Gate-level descriptions provide a structural (schematic) description of a circuit as an interconnection of basic blocks called gates, whereas every gate has a known and relatively simple boolean behavior. Switch-level descriptions represent the lowest level of circuit design abstraction which again is a structural (schematic) one and contains an interconnection of switches (transistors) that implement the desired functionality of the circuit.

RTL is often the preferred abstraction level for most design activities. However, any RTL design has to be translated into an equivalent switch-level design as a necessary step prior to the fabrication of the chip. This translation can be performed using so-called synthesis EDA tools that compile RTL designs into a predefined, technology-specific gate-level cell library that contains a switch-level schematic for each cell. In some cases, especially when a chip has to meet stringent operating requirements (speed, power consumption, etc.), certain blocks of the chip may be designed at the switch level.

For a number of reasons, it is highly desirable and advantageous to accurately translate the functionality implemented by a circuit description containing switches into a higher level (gate or RTL) one. A very important application of such a technology is formal functional verification of circuits. Formal functional verification aims to ensure that a chip operates as expected based on appropriate mathematical models. Unlike traditional functional verification approaches, such as simulation, formal verification provides 100% coverage of a circuit's functionality. To enable formal functional verification at the mixed (switch and gate) level, a method is required to translate the structural description of a circuit into a functional (Boolean) description in the corresponding mathematical model. Other application areas for mixed (switch and gate) level circuit analysis and translation include technology-specific library characterization, Automatic Test Pattern Generation (ATPG), and re-synthesis and re-design of chips from one chip manufacturing technology to another.

Various techniques have been developed for the analysis of the behavior of mixed (switch and gate) level circuits. These techniques process the circuit in parts called Channel Connected Components (CCC). A CCC comprises transistors that are electrically connected to each other via their channel terminals and other transistors in the CCC, and gates connected to the channel terminals of any transistor in the CCC. The CCCs in a circuit can be analyzed one at a time; individual CCC behavior is then composed to obtain the behavior of the complete circuit.

A key aspect in deriving a functional model of a single CCC is the ability to identify and properly characterize the behavior introduced by structural dependency loops within CCCs in the circuit. A structural loop within a CCC occurs when one or more transistors and/or one or more gates in the CCC is/are controlled by one or more nets that are also within that CCC. Such nets are referred to as internal inputs of the CCC, in contrast to the external inputs of the CCC, which are outputs of other CCCs and thus do not belong to the CCC. Structural loops within a CCC may result in combinational, sequential, or oscillatory behavior.

Existing approaches resolve internal inputs by either introducing a potentially large number of nets in an unknown state, or completely ignore the problem. For example, the ANAMOS and TRANALYZE tools, as presented in the article "Boolean Analysis of MOS Circuits" by R. E. Bryant published in IEEE TCAD, 6(4), pp. 634–649, July 1987, and later refined in the article "Extraction of Gate-Level Models from Transistor Circuits by Four-Valued Symbolic Analysis" also by R. E. Bryant and published in ICCAD '91 form and then solve a system of Boolean equations for each CCC. This works well when the system has a unique solution, but results in many unknown net values otherwise. The ANAMOS and TRANALYZE tools were developed at the Carnegie Mellon University for the purpose of transistor-level simulation and mapping into a hardware-based gate-level simulator and cannot properly analyze designs which contain sequential behavior in a single CCC. This essentially prohibits the interaction of ANAMOS and TRANALYZE with the majority of the currently available EDA CAD tools.

Another approach to mixed (gate and switch) level circuit analysis has been implemented in the Verity tool developed by International Business Machines Corporation, and described in the article "Verity—a Formal Verification Program for Custom CMOS Circuits" by A. Kuehlmann, A. Srinivasan and D. P. LaPotin published in the IBM R & D Journal, Vol. 39, pp. 149–165, January–March 1995. This tool is a logic checker working at the switch level. The tool does not output an equivalent higher-level model nor does it work directly on sequential designs.

BRIEF SUMMARY OF THE INVENTION

The present invention therefore seeks to provide a method of analyzing a circuit having at least one structural loop within a channel connected component, which overcomes, or at least reduces the above-mentioned problems of the prior art.

Accordingly, the invention provides a method of analyzing a circuit; the circuit having at least one structural loop within a channel connected component, the method comprising the steps of:

at least partly notionally splitting the circuit into its constituent channel connected components;

detecting at least one structural loop within a channel connected component;

inserting a pair of temporary Boolean variables at a break point in the at least one structural loop at an internal input within the channel connected component;

repeating the step of inserting a pair of temporary Boolean variables for each detected structural loop within the channel connected component;

analyzing the channel connected component utilizing the pairs of temporary boolean variables at the break points in order to obtain a pair of Boolean equations at each break point representing the functionality of the channel connected component at that break point to produce a system of Boolean equations for the break points within the channel connected component; and solving the system of Boolean equations to produce a result that indicates whether the channel connected component has oscillatory, combinational or sequential behavior.

The result produced in the step of solving the system of Boolean equations can, conveniently, depend on the number of solutions that the system of Boolean equations has.

Preferably, a result that indicates that the system of Boolean equations has no solutions represents oscillatory behavior in the channel connected component, a result that indicates that the system of Boolean equations has a single solution represents combinational behavior in the channel connected component and a result that indicates that the system of Boolean equations has more than one solution represents sequential behavior in the channel connected component.

When the result indicates that the system of Boolean equations has no solutions, the method preferably further comprises the step of outputting a signal indicating that the channel connected component exhibits oscillatory behavior.

When the result indicates that the system of Boolean equations has a single solution, the method preferably further comprises the step of utilizing the single solution to produce an RTL representation of the channel connected component in any desired RTL language.

When the result indicates that the system of Boolean equations has more than one solution, the method preferably further comprises the steps of:

determining which internal inputs are coupled solely to data storage elements in the channel connected component and which internal inputs are at least partly dependent on external inputs to the channel connected component;

replacing the temporary Boolean variables by predetermined parameters at the break point in the at least one structural loop at each internal input which is coupled solely to data storage elements in the channel connected component; and resolving the system of Boolean equations using the predetermined parameters in place of the temporary Boolean variables that were replaced to produce a pair of Boolean functions for each of the internal inputs that are at least partly dependent on an external input.

In a preferred embodiment, the pairs of Boolean functions are utilized to produce an RTL representation of the channel-connected component in any desired RTL language.

BRIEF DESCRIPTION OF THE DRAWINGS

One embodiment of the invention will now be more fully described, by way of example, with reference to the drawings, of which.

DETAILED DESCRIPTION OF THE DRAWINGS

Figure 1:
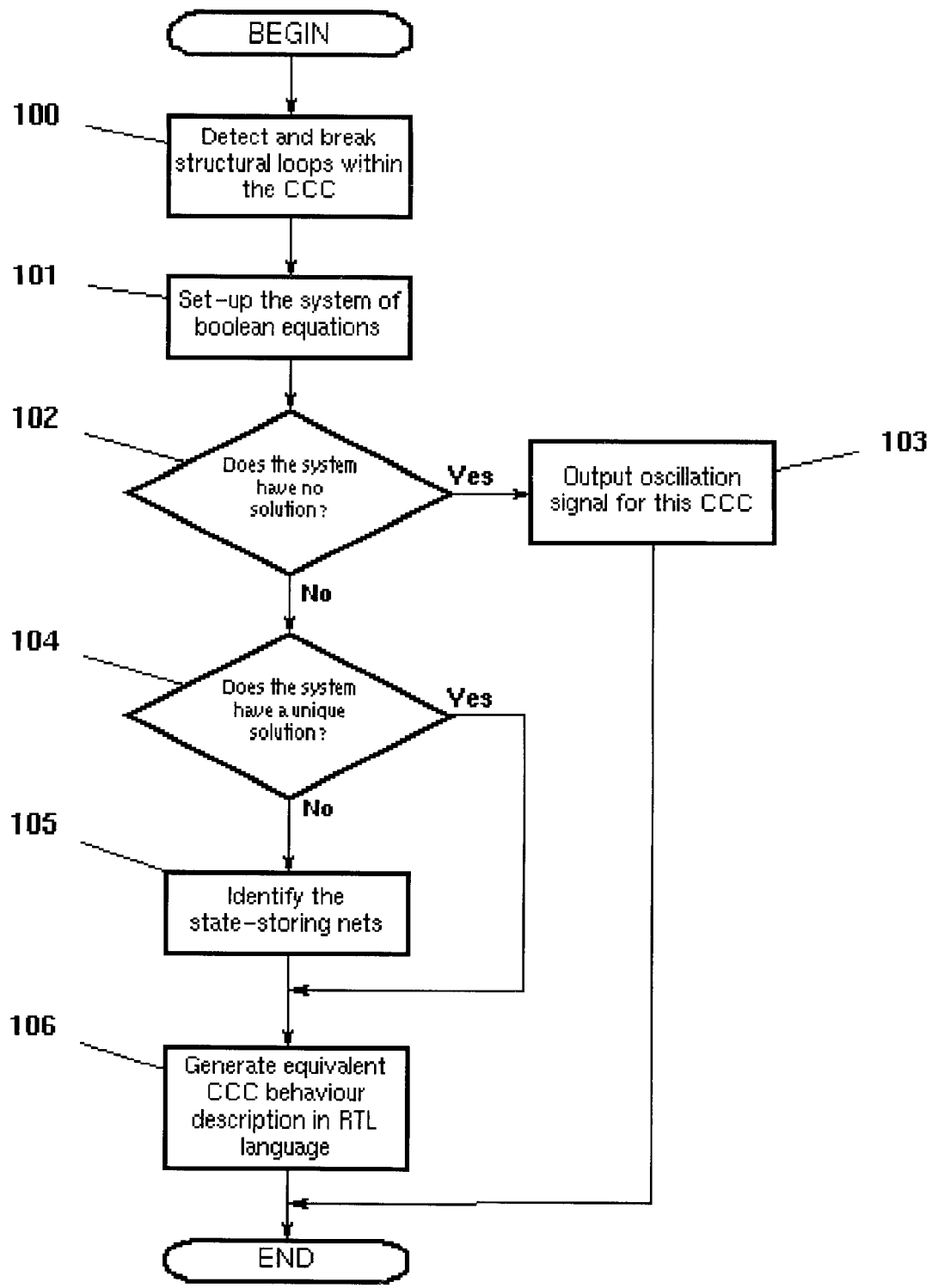
FIG. 1 shows a flow chart of a method of analyzing a circuit incorporating an embodiment of the present invention.
Figure 3:
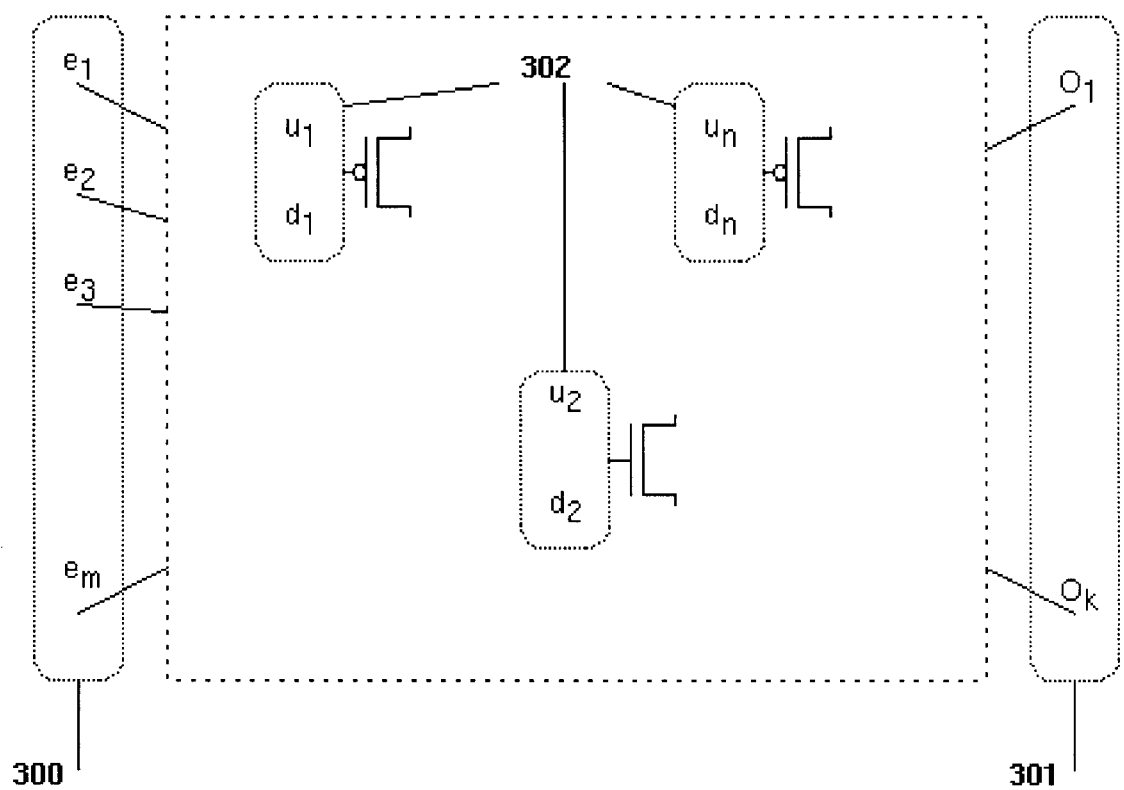
FIG. 3 illustrates the step of inserting pairs of Boolean variables at each internal input of the CCC prior to forming the system of Boolean equations.

Thus, as shown in FIG. 1, an embodiment of the present invention contains a number of algorithmic steps. The following description assumes that the circuit being analyzed has already been split into its constituent CCCs using known graph-based techniques (see the article "Boolean Analysis of MOS Circuits" by R. E. Bryant published in IEEE TCAD, 6(4), pp. 634–649, July 1987). The embodiment to be described here is concerned with deriving the equivalent behavior of a CCC that contains structural loops. Such a CCC is schematically represented in FIG. 3, and has a number of external inputs 300 and outputs 301.

In step 100 in FIG. 1, structural loops in the CCC are detected. One particular approach is to identify the internal inputs to that CCC. By definition, an internal input is a net that controls a gate of a transistor or an input of a logic gate that are members of that CCC, and the net itself belongs to that CCC.

In the text that follows the following notation is used:

Boolean function names start with an upper-case letter, e.g. F0, X1, Z1;

Boolean variable names start with a lower-case letter, e.g. v0, v1;

Boolean negation is denoted by the operator '!';

Boolean conjunction is denoted by the operator '&';

Boolean disjunction is denoted by the operator '|'.

The operation of step 100 is further illustrated in FIG. 3. Each structural loop is logically broken at the internal inputs by associating a pair of boolean variables (302) $u_i$ and $d_i$ representing the pull-up and pull-down conditions at the corresponding internal input, respectively.

In step 101, a system of Boolean equations B is formed. Known techniques, for example, explicit path enumeration, are used to obtain the actual pull-up and pull-down functions $U_i$ and $D_i$, at each internal input, with respect to the Boolean variables $e_i$ assigned to the external inputs 300 and the pairs of Boolean variables $u_i$ and $d_i$ assigned to the internal inputs. For any given internal input k, the following equations must hold when the signals at the external and internal inputs are stable:

$$u_k = U_k$$

$$d_k = D_k$$

Thus, we derive a pair of equations per internal input and add these to the system of Boolean equations B. Essentially, the system of Boolean equations B describes the conditions under which the signals at all net in the CCC hold a stable value. The total number of equations in B is 2n, where n is the number of internal inputs found in this CCC. At this stage, the pairs of Boolean variables $u_i$ and $d_i$ are the unknown entities in the system, whereas the Boolean variables $e_i$ serve as parameters in B.

In steps 102, 104, and 105, a known technique, for example Gaussian elimination, is used to either establish the solvability or solve the system of Boolean equations B with respect to one or more of the unknown entities.

In step 102, a check is made whether the system of Boolean equations B has at least one solution. If the system B has no solutions, then the CCC cannot reach a stable state, which corresponds to an oscillating behavior, and a signal is output to the user in step 103. If it is established that system B has at least one solution, step 104 is executed next.

In step 104, a check is made whether the system of Boolean equations B has exactly one solution. If system B has exactly one solution, then the behavior of the CCC is uniquely determined by the values of the Boolean variables $e_i$ and thus the CCC exhibits combinational behavior. If the system of Boolean equations B has exactly one solution, step 106 is executed, otherwise step 105 is executed prior to step 106.

Figure 2:
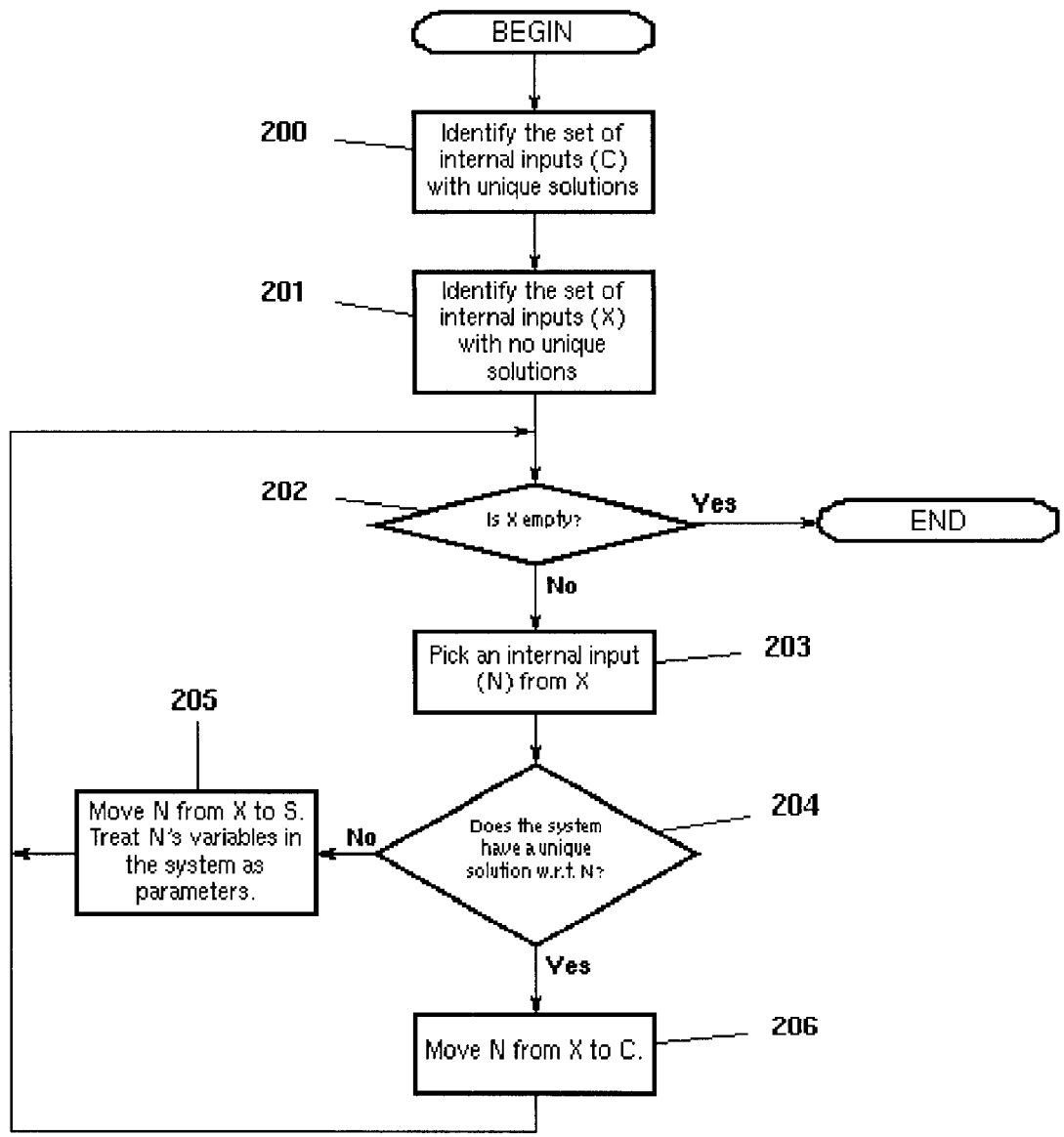
FIG. 2 shows a flow chart for the step in the flow chart of FIG. 1 of identifying the state storing nets in the CCC.

In step 105, it is known that the system of equations B has more than one solution. This means that, although the signals in the CCC can reach a stable state, that state is not uniquely determined by the values of the Boolean variables $e_i$ and thus the CCC exhibits sequential behavior. Thus, it is necessary to identify the internal inputs that store the state of the CCC. Step 105 is described in more detail by the flow chart in FIG. 2, which itself contains seven steps.

In step 200, the set of pairs of Boolean variables $u_i$ and $d_i$ that have unique solutions are identified, and the corresponding internal inputs are put in the set of nets C. This set of internal inputs identifies those which do not store a state.

In step 201, all internal inputs that are not members of C are put into another set of internal inputs X for further examination in subsequent steps.

In step 202 the number of internal inputs in X is examined; step 105 is finished when X becomes empty. If there is at least one internal input in X, step 203 is executed.

In step 203, an internal input N is chosen from the set X. In step 204, a check is made whether the system of Boolean equations B has a unique solution with respect to the pair of Boolean variables $u_N$ and $d_N$. If such a unique solution exists, step 206 is executed, otherwise step 205 is executed.

In step 205, the internal input N is added to the set of state storing nets S. To reflect the fact that N represents an independent input in the CCC, its pair of boolean variables $u_N$ and $d_N$ are no longer treated as unknown entities but rather as additional parameters in the system of Boolean equations B.

In step 206, the internal input N is added to the set of nets C that are not storing a state in the CCC.

Steps 202, 203, 204, 205, and 206 are executed until every internal input is either a member of S (and thus identified as a state storing net) or a member of C (and thus identified as a net that does not store a state).

Figure 4:
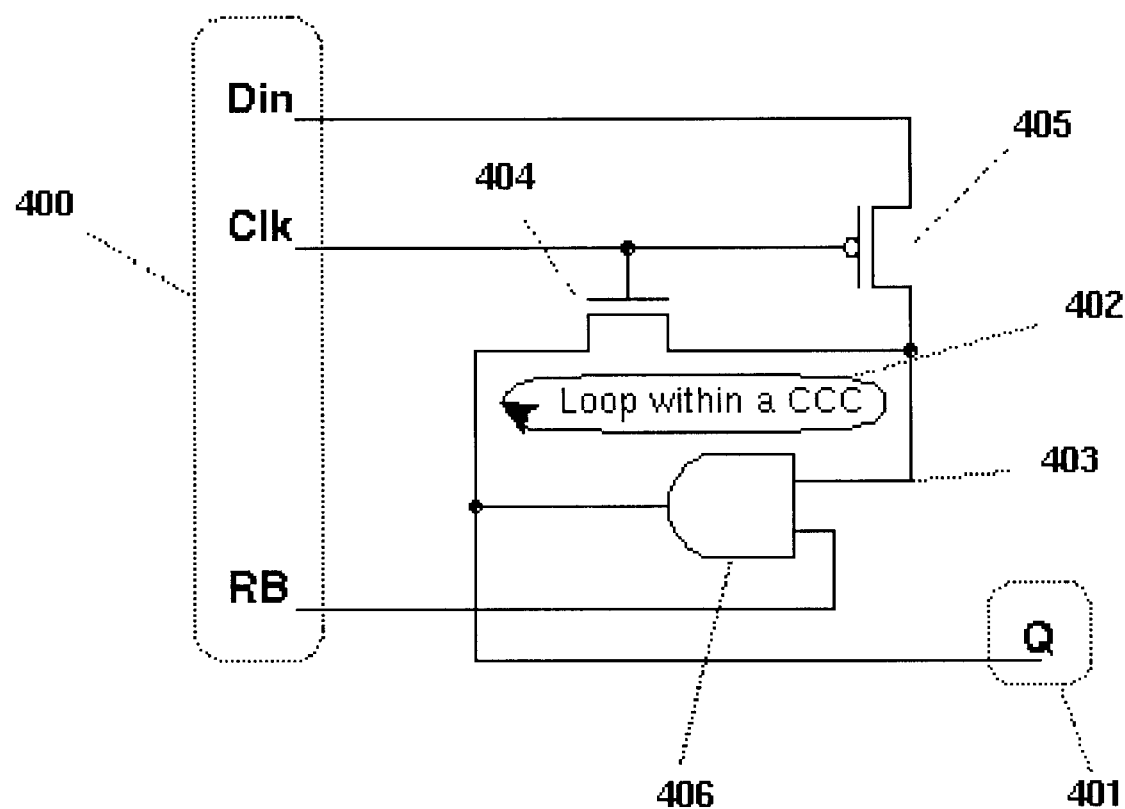
FIG. 4 shows an example of a circuit to which the method shown in FIG. 1 can be applied.

In step 106, the derived CCC behavior is represented in an RTL language. A separate approach is used for the nets that store a state and those that do not store a state. For a net N that does not store a state, the solution of the system of Boolean equations B with respect to the corresponding pair of Boolean variables $u_N$ and $d_N$ represents the pull-up and pull-down conditions for the net N. As an example of the output only, the equivalent RTL statements in the Verilog language are given as:

assign $N$=<solution for $u_N$ in $B$>? 1'b1:1'bz;

assign $N$=<solution for $d_N$ in $B$>? 1'b0:1'bz;

For a net N that does store a state in the CCC, the system of Boolean equations B is solved with respect to the corresponding pair of Boolean variables $u_N$ and $d_N$ thus obtaining the functions $UX_N$ and $DX_N$, respectively. The latter two functions express the conditions under which the state storing net N may be pulled up or down, respectively. The function $UX_N$ & $DX_N$ therefore represents the condition under which the state storing net may have a value of 0 or 1, or, in other words, keeps its previous value. The function $!UX_N$ represents the condition that the net is pulled to 0 by the CCC, and the function $!DX_N$ represents the condition that the net is pulled to 1 by the CCC. Since the pair of boolean variables $u_N$ and $d_N$ serve as parameters in B, the actual pull-up and pull-down functions $UX_N$ and $DX_N$ may contain references to that pair of Boolean variables. To remove this dependency, the pair of Boolean variables $u_N$ and $d_N$ are universally quantified out using known Boolean function manipulation techniques (such as a Binary Decision Diagram representation) from both $UX_N$ and $DX_N$, thus deriving $UX'_N$ and $DX'_N$, respectively. As an example of the output for such a state storing net only, the equivalent RTL statements in the Verilog language are shown as:

trireg $N$;

assign $N$=$!DX'_N$ ?1'b1:1'bz;

assign $N$=$!UX'_N$ ?1'b0:1'bz;

In FIG. 4, the method described above is illustrated as applied to a simple mixed (switch and gate) level circuit implementing a latch with an asynchronous reset signal. The latch has three input ports 400, and a single output port 401. The whole example circuit comprises a single CCC containing the transistors 404 and 405 as well as the AND gate 406. The CCC contains one structural loop 402 with the internal input being net 403. There is no internal CCC loop between the transistors 404 and 405 as the input port Clk serves as an external input to the CCC of the latch.

In step 100, the CCC of the latch is checked for the presence of structural loops and net 403 is identified as an internal input. The loop is broken logically at net 403 by assigning the pair of variables $u_0$ and $d_0$ to that net. In step 101, the following system of Boolean equations is produced:

$u_0$=$Din$ & $!Clk$ | $RB$ & $u_0$ & ($Din$ |$Clk$)

$d_0$=$!Din$ & ($!Clk$ | $!RB$ | $d_0$) |$Din$ & $Clk$ & ($!RB$ |$d_0$)

In step 102, the system of Boolean equations is found to have a solution, thus step 104 is executed. In step 104, the system of Boolean equations is found to have more than one solution, therefore, step 105 (and respectively 200) is executed next. In step 200, the set C is found to be empty. In step 201, the set X is found to contain the net 403. Since X is currently non-empty, the check at step 202 indicates that step 203 is to be executed. In step 203, the only net in X (net 403) is picked. Since the check in step 204 establishes that the system of Boolean equations does not have a unique solution with respect to the pair of Boolean variables $u_0$ and $d_0$, step 205 is executed; net 403 is moved into the set S and X becomes empty. The following check in step 202 succeeds, which ends the execution of step 105.

In step 106, output is generated for net 403 only. As it was previously established that net 403 is a state storing net (member of S), $UX_0$ and $DX_0$ are computed as:

$DX_0$=!($Din$ & $!Clk$ | $RB$ & $u_0$ & ($Din$ | $Clk$))

$UX_0$=!($!Din$ & ($!Clk$ | $!RB$ | $d_0$) |$Din$ & $Clk$ & ($!RB$ | $d_0$))

and the corresponding $DX'_0$ and $UX'_0$ functions are:

$DX'_0$=!($Din$ & $!Clk$)

$UX'_0$=!($!Din$ & $!Clk$ | $!RB$ & ($!Din$ | $Clk$))

which, as an example only, can be represented in Verilog as:

```
trireg net403;

assign net403=Din & !Clk ? 1' b1:1'bz;

assign net403=!Din & !Clk | !RB & (!Din | Clk) ? 1'b0:1'bz;
```

Thus, extracted higher-level model for designs containing static memory storage do not contain unknown net values and closely resembles the structure of the original mixed-level design.

It will be appreciated that although only one particular embodiment of the invention has been described in detail, various modifications and improvements can be made by a person skilled in the art without departing from the scope of the present invention.

What I claim is:

1. A method of analyzing a circuit, the circuit having at least one structural loop within a channel connected component, the method comprising the steps of:

at least partly notionally splitting the circuit into its constituent channel connected components;

detecting at least one structural loop within a channel connected component;

inserting a pair of temporary boolean variables at a break point in the at least one structural loop at an internal input within the channel connected component;

repeating the step of inserting a pair of temporary boolean variables for each detected structural loop within the channel connected component;

analyzing the channel connected component utilizing the pairs of temporary boolean variables at the break points in order to obtain a pair of boolean equations at each break point representing the functionality of the channel connected component at that break point to produce a system of boolean equations for the break points within the channel connected component; and solving the system of boolean equations to produce a result that indicates whether the channel connected component has oscillatory, combinational or sequential behavior.

2. A method of analyzing a circuit according to claim 1, wherein the result produced in the step of solving the system of boolean equations depends on the number of solutions that the system of boolean equations has.

3. A method of analyzing a circuit according to claim 2, wherein a result that indicates that the system of boolean equations has no solutions represents oscillatory behavior in the channel connected component.

4. A method of analyzing a circuit according to claim 3, further comprising the step of outputting a signal indicating that the channel connected component exhibits oscillatory behavior when the result indicates that the system of boolean equations has no solutions.

5. A method of analyzing a circuit according to claim 2, wherein a result that indicates that the system of boolean equations has a single solution represents combinational behavior in the channel connected component.

6. A method of analyzing a circuit according to claim 5, further comprising the step of utilizing the single solution to produce an RTL representation of the channel connected component in any desired RTL language when the result indicates that the system of boolean equations has a single solution.

7. A method of analyzing a circuit according to claim 2, wherein a result that indicates that the system of boolean equations has more than one solution represents sequential behavior in the channel connected component.

8. A method of analyzing a circuit according to claim 7, further comprising, when the result indicates that the system of boolean equations has more than one solution, the steps of:

determining which internal inputs are coupled solely to data storage elements in the channel connected component and which internal inputs are at least partly dependent on external inputs to the channel connected component;

replacing the temporary boolean variables by predetermined parameters at the break point in the at least one structural loop at each internal input which is coupled solely to data storage elements in the channel connected component; and resolving the system of boolean equations using the predetermined parameters in place of the temporary boolean variables that were replaced to produce a pair of boolean functions for each of the internal inputs that are at least partly dependent on an external input.

9. A method of analyzing a circuit according to claim 8, further comprising utilizing the pairs of boolean functions to produce an RTL representation of the channel connected component in any desired RTL language.

* * * * *